United States Patent [19]

Eisenberg

[11] Patent Number: 5,570,063
[45] Date of Patent: Oct. 29, 1996

[54] RF POWER AMPLIFIER WITH SIGNAL PREDISTORTION FOR IMPROVED LINEARITY

[75] Inventor: John A. Eisenberg, Los Altos, Calif.

[73] Assignee: Spectrian, Inc., Mountain View, Calif.

[21] Appl. No.: 444,183

[22] Filed: May 18, 1995

[51] Int. Cl.$^6$ .................................................. H03F 1/32
[52] U.S. Cl. ........................................ 330/149; 330/151
[58] Field of Search .................................. 330/107, 129, 330/136, 149, 151

[56] References Cited

U.S. PATENT DOCUMENTS

| | | | |
|---|---|---|---|
| 4,879,519 | 11/1989 | Myer | 330/149 |
| 5,157,345 | 10/1992 | Kenington et al. | 330/149 |
| 5,334,946 | 8/1994 | Kenington et al. | 330/144 |

OTHER PUBLICATIONS

Kenington, et al., RF Linear Amplifier Design, Centre for Communications Research, University of Bristol, United Kingdom, undated (after Jun. 1993 reference), pp. 1–10.
Brochure of Centre for Communications Research, Narrowband Amplifier Design, University of Bristol, United Kingdom, undated.
Brochure of British Technology Group Ltd., Broadband Linear Power Amplifier, London, United Kingdom, undated, 2 pages.

*Primary Examiner*—Steven Mottola
*Attorney, Agent, or Firm*—Townsend and Townsend and Crew; Henry K. Woodward

[57] ABSTRACT

An RF power amplifier utilizes predistortion to improve linearity of the amplifier. RF carrier signals from an input terminal are coupled to a power amplifier through a first amplitude and phase adjustor serially connected with a predistortion amplifier having signal distortion characteristics of the power amplifier. A first control loop includes a subtractor for receiving RF carrier signals from the input terminal and signals from the predistortion amplifier and producing a predistortion signal for applying to the power amplifier through a path including a second amplitude and phase adjustor and an error amplifier. A first loop control unit receives the RF carrier signals from the input terminal and the distortion signal and produces control signals for the first amplitude and phase adjustor for minimizing RF carrier signals in the predistortion signal. A second control loop including a second loop control unit receives signals from the output of the power amplifier and signals from the predistortion amplifier and generates control signals for the second amplitude and phase adjustor to minimize distortion in signals at the output of the power amplifier. Each of the control units includes a digital signal processor for generating control signals for the amplitude and phase adjustor, and frequency reduction circuitry is provided in each of the control loops for reducing the frequencies of input signals to within the range of the digital signal processors.

10 Claims, 4 Drawing Sheets

5,570,063

RF POWER AMPLIFIER WITH SIGNAL PREDISTORTION FOR IMPROVED LINEARITY

BACKGROUND OF THE INVENTION

This invention relates generally to radio frequency (RF) power amplifiers and, more particularly, the invention relates to an RF power amplifier having improved linearity and reduced intermodulation distortion.

RF amplifiers that operate outside of the small signal range are inherently nonlinear and thus introduce signal distortion when multiple signals are amplified. Recent requirements in cellular telephone technology have mandated increased capacity which in turn requires broad bandwidth, high dynamic range linear amplifiers where the output spectrum is free of unwanted intermodulation products. Intermodulation distortion within the RF amplifier passband can severely impede proper transmission and reception of cellular signals.

The concept of feedforward amplification to reduce distortion is known and has been successfully applied to RF amplifiers in the past. U.S. Pat. No. 5,157,345 and No. 5,334,946 disclose a feedforward amplifier which employs two signal cancellation loops in generating an error signal and then injecting the error signal as a feedforward correction signal. Copending application Ser. No. 08/369,546 filed Jan. 6, 1995, assigned to the present assignee, discloses a feedforward RF amplifier having a high dynamic range and low intermodulation distortion through use of closed loop control circuitry. Two control loops are employed with a main amplifier and an error amplifier. Copending application Ser. No. 098/412,479 filed Mar. 28, 1995, assigned to the present assignee, discloses a similar feedforward amplifier which employs a main amplifier for amplifying both the main signal and the error signal. In both applications, pilot signals are injected for use in determining amplitude and phase requirements for intermodulation distortion (IMD) cancellation.

Adaptive predistortion is another technique for error correction in RF power amplifiers. In effect, the input signal to a power amplifier is predistorted with intermodulation components inserted at the input of the RF power amplifier which correspond to the intermodulation components introduced by the power amplifier but of such phase and amplitude so that the intermodulation components cancel in the power amplifier.

The present invention is directed to an RF power amplifier with closed loop predistortion without the use of a pilot signal for error correction.

SUMMARY OF THE INVENTION

In accordance with the invention, an RF power amplifier uses adaptive predistortion to correct intermodulation distortion of the power amplifier. The amplifier includes a predistortion amplifier connected in cascade with the main amplifier, the predistortion amplifier being smaller than the main amplifier but having the same intermodulation distortion characteristics as the main amplifier and used to generate the signal for predistorting the input of the main amplifier.

A first control loop maintains the proper phase and amplitude relationship between a time delayed sample of signals incident on the predistortion amplifier (PDA) and a sample of the same signals and their distortion products at the output of the PDA. If the time delay is such that both samples arrive at a summer at the same time, and that the signals are maintained by the first control loop at essentially equal amplitude and essentially 180° out of phase, then the signals cancel leaving principally the distortion products. The distortion products are maintained at the proper amplitude and phase by a second control loop so that when these products are injected into the input of the main power amplifier along with the time delayed output of the PDA that cancellation of distortion products takes place in the main power amplifier, thus minimizing or eliminating distortion at the output of the main power amplifier.

In accordance with a feature of the invention, the first and second control loops suppress the carrier signals and maintain the proper predistortion amplitude and phase to linearize the main power amplifier respectively. Further, a pilot signal is not required.

The invention and objects and features thereof will be more readily apparent from the following detailed description and appended claims when taken with the drawing.

DETAILED DESCRIPTION OF ILLUSTRATIVE EMBODIMENTS

Figure 1:
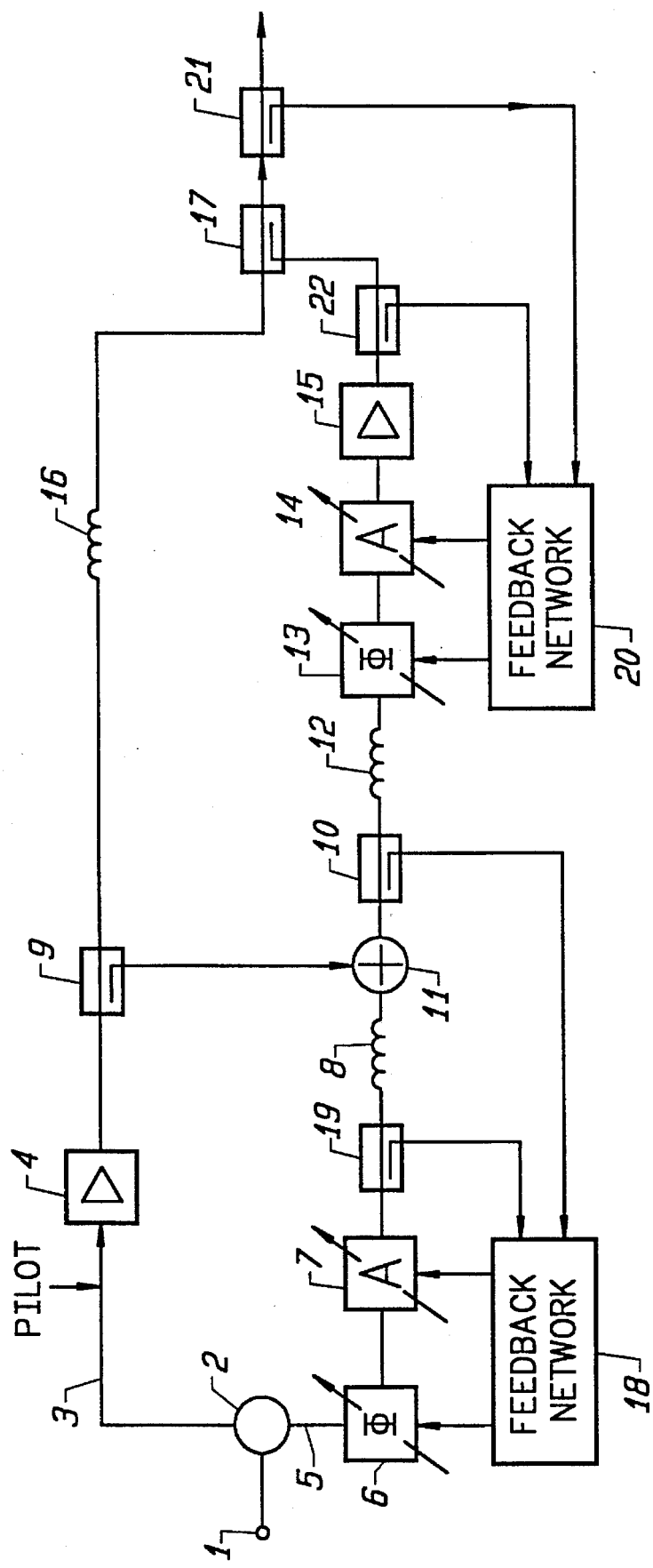
FIG. 1 is a functional block diagram of a prior art feedforward power amplifier.

FIG. 1 is a schematic of a feedfoward RF amplifier as disclosed in U.S. Pat. No. 5,157,345, supra. As described in the '345 patent, an input signal at a terminal 1 is divided by a splitter 2 between two paths: a main path 3 to a main amplifier 4, and a subsidiary path 5 to phase and gain adjustment components 6 and 7. The output signal from the main amplifier 4 includes distortion products in the form of intermodulation. A sample of the main amplifier output is obtained by the directional coupler 9 and fed to a combiner 11. The other input to the combiner 11 is arranged to be an antiphase to the sampled power amplifier output (thus forming a subtractor) by correct selection of a time delay element 8 and correct adjustment of the phase shift component 6. The variable gain component 7 adjusts the amplitude so that the amplitude levels are equal. The signal obtained from the output of the subtractor 11, in theory, contains only the distortion products and forms an error signal.

By similar means, the error signal is used to cancel the distortion products present in the output of the main amplifier 4. In this case the main amplifier signal, having traversed through the directional coupler 9, is delayed by a time delay element 16 and fed to one input of a directional coupler 17 acting as a subtractor. The other input of the directional coupler 17 is obtained by processing the error signal derived previously from the combiner (subtractor) 11 using a time delay element 12, phase and gain adjustment components 13 and 14, and an error amplifier 15. The variable gain and phase shift components 13 and 14 are adjusted for maximum cancellation of the unwanted distortion products present in the output signal of the coupler 17 and also allow for phase and amplitude errors in the amplifier 15.

The reference signal in the path 5 is independently adjusted in phase and amplitude by the variable phase shift and variable gain components 6 and 7 in order to compensate for the particular gain in phase anomalies of the power amplifier 4 at the frequency of interest. The gain in phase weighted reference signal is then time delayed to form the input to the adder 11.

Automatic adjustment to the phase shift and gain components 6 and 7 is achieved by obtaining a sample of the error signal by a direction of coupler 10 following the subtractor 11, which forms one input to a feedback network 18. A sample of the reference signal is obtained using a directional coupler 19 and forms the second signal feeding the feedback network 18. Suitable processing of these two signals yields two control signals for the variable phase and gain components 6 and 7.

The variable phase and gain components 13 and 14 are controlled by a further feedback network 20. The inputs to this control network are from a directional coupler 21 following the time delay element 16 and from a directional coupler 22 following the error amplifier 15. Suitable processing of these two signals yields the necessary control signals for the phase and amplitude adjustment components 13 and 14.

As further described in the '345 patent, the feedback networks 18, 20 employ digital signal processors (DSP) in order to remove distortion and problems arising with temperature and aging. The input frequencies for the DSPs are reduced in frequency so that they are about 1 KHz. This is accomplished by mixing the input signals with signals from respective oscillators at frequencies differing by about 1 KHz. By mixing these frequencies with a carrier frequency and a reference frequency, and then mixing the lower sidebands of the first mixers, a new error signal can be obtained at 1 KHz with the error carried forward.

Figure 2:
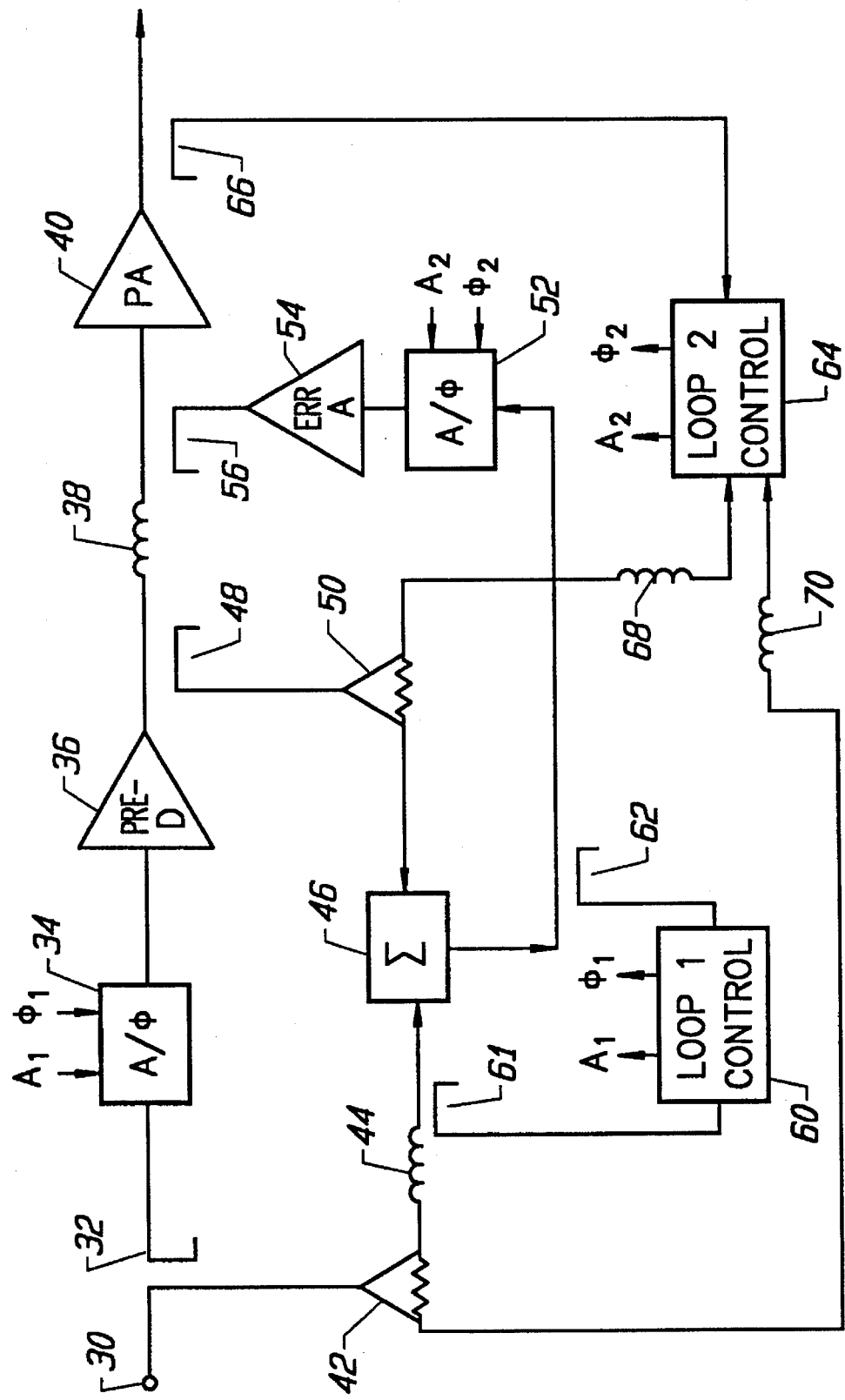
FIG. 2 is a functional block diagram of a predistortion power amplifier in accordance with the present invention.

FIG. 2 is a functional block diagram of an RF power amplifier with signal predistortion for error correction in accordance with the present invention. The predistorted linear power amplifier can be combined with a feedforward loop, as disclosed in the '345 patent to further reduce distortion. However, the predistortion correction in accordance with the invention is relatively simple in circuitry and can function alone as a linear RF power amplifier. An input signal at 30 is split by coupler 32 with one portion of the input signal passing through amplitude and phase adjuster 34 and a predistortion amplifier 36 and coupler 48 and time delay element 38 and coupler 56 to the input of the main power amplifier 40. A second portion of the input signal 30 passes through a signal splitter 42 with one portion going through delay element 44 to one input of subtractor 46. This input to the subtractor is a delayed sample of the input signal. A second input to subtractor 46 is obtained from the output of the predistortion amplifier 36 by means of coupler 48 and signal splitter 50. This input to the subtractor contains a sample of the amplified input signal and distortion products generated by the PPDA (36).

The predistortion amplifier 36 introduces the same intermodulation distortion components as the power amplifier 40 but at a lower output power level, and the signal sampled by coupler 48 includes the input signal spectrum along with the resulting intermodulation components. Subtractor 46 subtracts the signals from the signals and distortion and produces an output consisting largely of the intermodulation distortion products as an error signal. This error signal is applied through amplitude and phase adjuster 52 and error amplifier 54 through coupler 56 as part of the input signal to power amplifier 40 along with the amplified and delayed output of predistortion amplifier 36. The error signal reintroduces the intermodulation components with the proper amplitude but in phase opposition to the intermodulation components generated by power amplifier 40. Consequently, the intermodulation products cancel and the output of power amplifier 40 is the amplified carrier signal introduced at terminal 30 with the intermodulation components suppressed.

Amplitude and phase adjuster 34 receives control signals $V_{A1}$, $V_{\phi 1}$ from a loop 1 control element 60 which receives as a first input a sample of the input signal at terminal 30 after passing through delay element 44 obtained from coupler 61. The other input of loop 1 control element 60 is the error signal from subtractor 46 obtained from a coupler 62. The $V_{A1}$, $V_{\phi 1}$ control signals eliminate or reduce carrier signals in the error signal seen at the output of subtractor 46.

Control signals $V_{A2}$, $V_{\phi 2}$ for the amplitude and phase adjuster 52 are generated by a loop 2 control 64. Loop 2 control element 64 receives as inputs a portion of the power amplifier 40 output through coupler 66 and a portion of the output of the predistortion amplifier 36 through coupler 48, power divider 50, and time delay 68. The carrier signal at input terminal 30 is passed through divider 42 and time delay 70 as another input to loop 2 control element 64 for use in eliminating the carrier signal from the other two inputs of loop 2 control element 64. Time delays 68 and 70 are chosen so that all three inputs to loop 2 control element 64 arrive at the same time. Control signals $V_{A2}$, $V_{\phi 2}$ are generated by loop 2 control element 64 for controlling the amplitude and phase adjuster 52 so that the error signal injected by coupler 56 into the input of power amplifier 40 eliminates or reduces the intermodulation components at the output of power amplifier 40.

Figure 3:
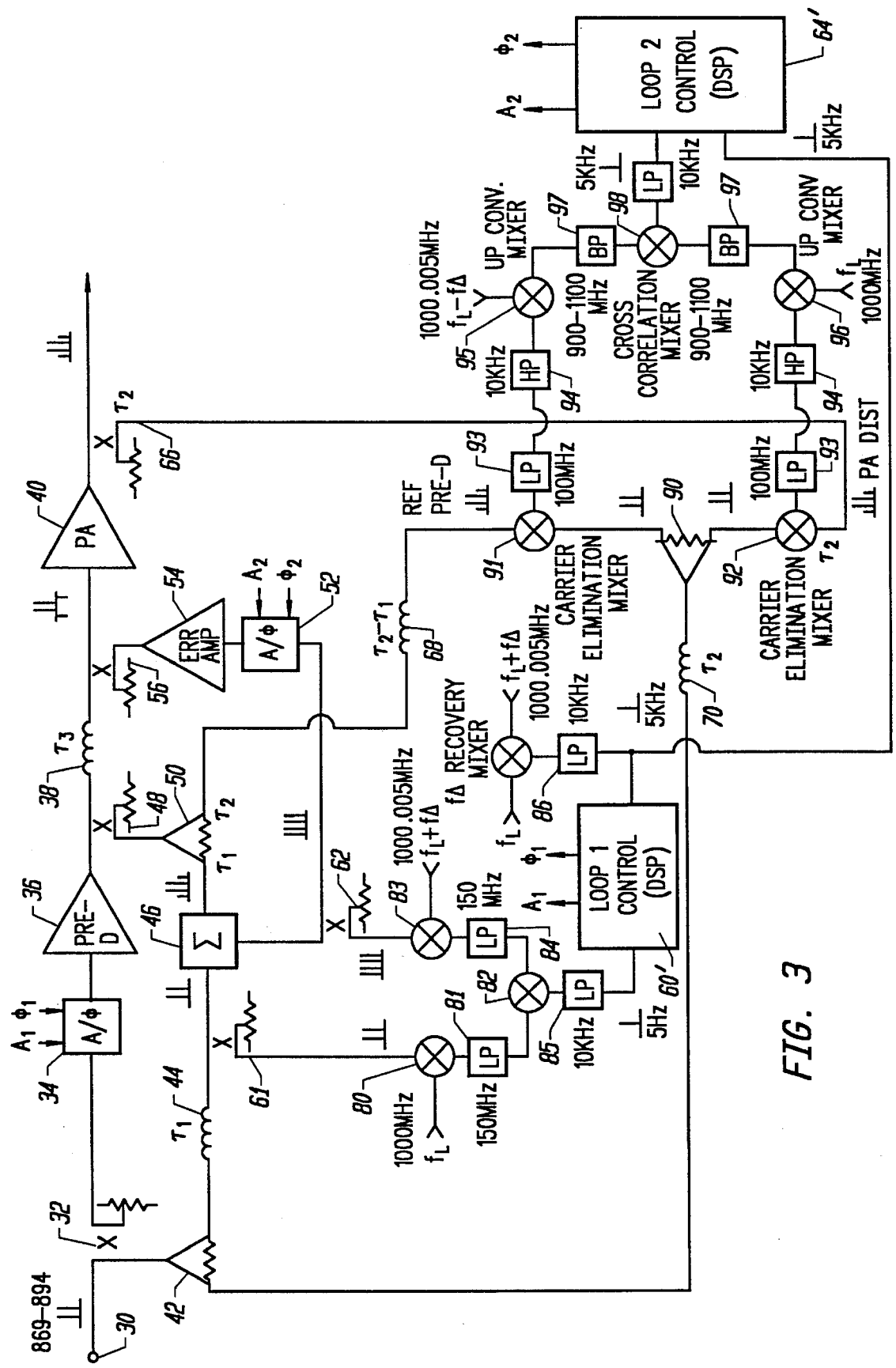
FIG. 3 is a detailed functional block diagram of one embodiment of a predistortion power amplifier in accordance with the invention.

FIG. 3 is a more detailed functional block diagram of the linear power amplifier with predistortion shown in FIG. 2. Like elements have the same reference numerals. In this embodiment digital signal processors (DSP) are employed in the loop 1 control element 60' and the loop 2 control element 64' with mixers operating on the carrier and error signals along with oscillator input signals to reduce the frequencies of the error signals as applied to the DSP units of the loop control. In this embodiment the input signal at 30 comprises one or more signals between 869 MHz and 894 MHz. For simplicity let us follow the case of two input signals at 869 MHz and 894 MHz. The first input signal to the loop 1 control signal processor 60 obtained by coupler 61, is mixed with a 1000 MHz oscillator signal, $f_L$ by mixer 80 and then passed through low pass filter 81 to obtain the difference frequencies (1000–869 MHz, 1000–894 MHz) as an input to multiplier 82. The error signal obtained by coupler 62 is mixed with an oscillator signal at a frequency of 1000.005 MHz ($f_L+f_A$) and the output of mixer 83 is passed through a low pass filter 84 to obtain the difference frequencies (1000.5 MHz–PDA output spectrum) as a second input to multiplier 82. The output of multiplier 82 is a signal at the frequency $f_A$, or 5 KHz, along with the down converted intermodulation components. The 5 KHz signal is proportional to the carrier level remaining at the output of subtractor 46. Thus if one can null the 5 KHz signal one has nulled the carriers at the output of subtractor 46. The 5 KHz signal plus IMD components are passed through a low pass filter 85 to eliminate the IMD components and then as one input to the loop 1 control DSP 60'. A second input to the loop 1 control DSP 60' is a 5 KHz reference signal obtained by mixing the two oscillator signals $f_L$ and $f_L+f_\Delta$ with the output passed through low pass filter 86. The loop 1 control DSP 60' then generates the control signals $V_{A1}$ and $V_{\phi1}$ which maintain carrier cancellation in loop 1.

The DSP subsystem 60' and 64' which is a portion of control elements 60 and 64, respectively, consists of a pair of A/D converters monitoring the 5 KHz error signal and the 5 KHz reference signal, the DSP chip and associated memory components and a pair of D/A converters used to generate $V_A$ and $V_\phi$. The DSP chip executes a program which causes the DSP subsystem to implement the control function shown in FIG. 4.

The 5 KHz error signal 99 produced by loop 1 or the 5 KHz error signal 101 produced by loop 2 is compared in phase with the 5 KHz reference signal 100. Both signals are first amplitude limited by limiters 102 and 103 and then multiplied by multiplier 104 The product so obtained is integrated by integrator 105 to yield a voltage proportional to the phase difference between the error and reference signals over a 180° range. This voltage is the phase control signal $V_\phi$. The amplitude control voltage is obtained by multiplying the amplitude limited reference 5 KHz signal from the output of limiter 103 with a π/2 phase shifted version of the 5 KHz error signal in multiplier 107. The result after integration by integrator 108 is a dc voltage proportional to the error signal amplitude. This voltage is the amplitude control voltage $V_A$.

Figure 4:
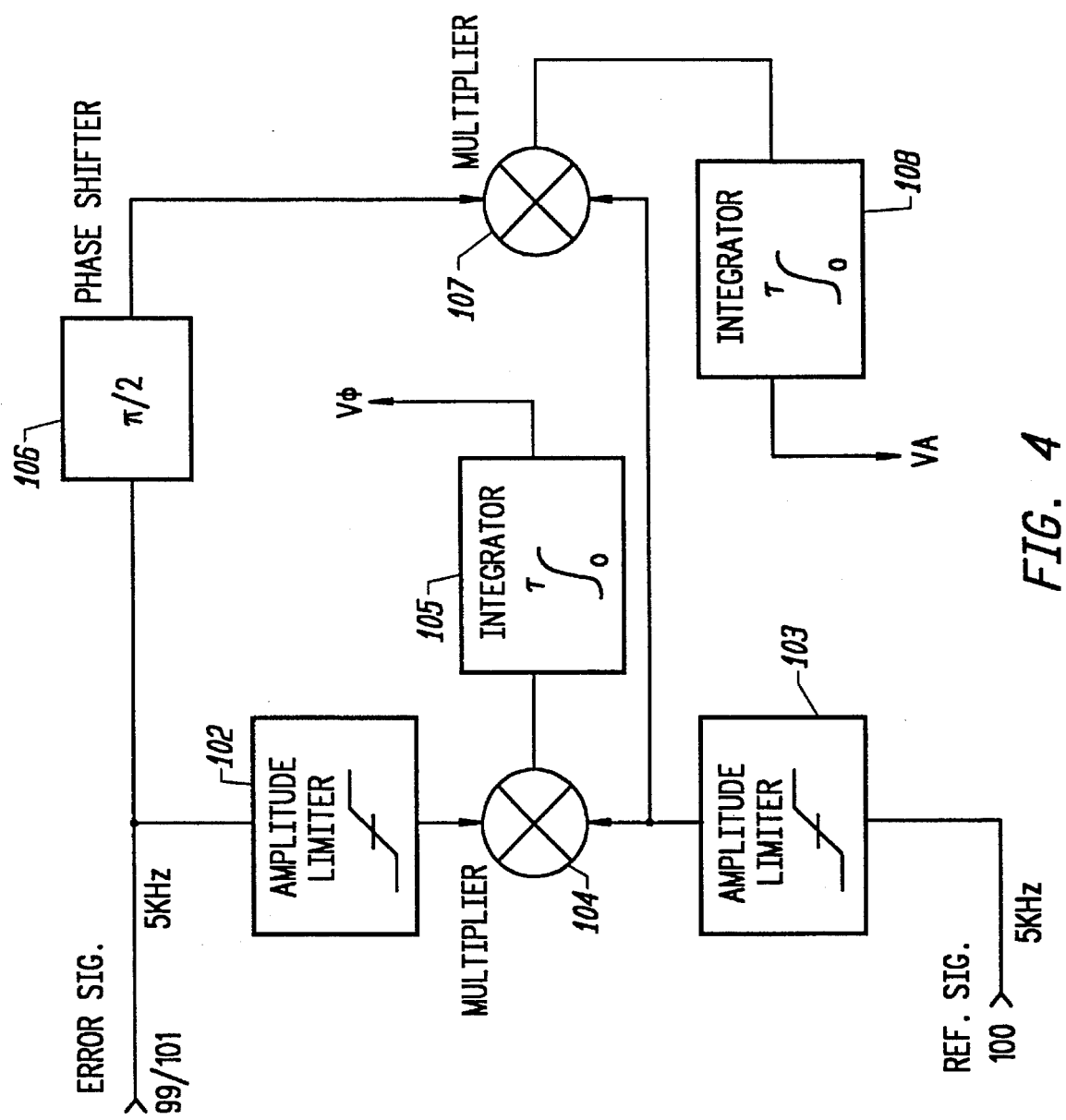
FIG. 4 is a functional block diagram of a digital signal processor (DSP) used in the predistortion power amplifier of FIG. 3.

All of the functionality shown in FIG. 4 is realized as a DSP algorithm. The code which implements the algorithm is in EPROM memory as firmware. The DSP subsystems in control signal processors 60' and 64' are essentially identical.

Similarly, the loop 2 control DSP 64' receives input signals which are adjusted in frequency. The input signals from input terminal 30 are passed through delay element 70, splitter 90, and applied as inputs to carrier elimination mixers 91 and 92. Mixer 91 mixes the delayed carrier signals with the delayed output of predistortion amplifier 36, and mixer 92 mixes the output of power amplifier 40 with the delayed carrier signals so that the carrier signals are converted to dc and twice their original frequency and are then eliminated from the outputs of the two mixers by the 100 MHz low pass filters 93 and 10 KHz high pass filters 94 to preserve only the distortion components and reject the carrier signals. Thus the input to mixer 95 is the distortion products generated by the PDA and the input to mixer 96 are the distortion products at the output of the main power amplifier 40. We wish to minimize the main power amplifier distortion products. The outputs of the high pass filters 94 are then mixed with a first oscillator signal at 1000.005 MHz in mixer 95 and with an oscillator frequency at 1000 MHz ($f_L$) in mixer 96. The outputs of the two mixers are then passed through bandpass filters 97 resulting in the distortion product spectrum appearing on either side of its respective local oscillator signal and then applied as inputs to cross correlation multiplier 98. The inputs to the cross correlation multiplier 98 contain the energy of the intermodulation components present at the output of main power amplifier 40 (mixer 96) and the intermodulation components at the output of the predistortion amplifier 36 (mixer 95). Multiplier 98 produces an output signal at the $f_\Delta$ frequency (5 KHz) which will null if the IMD components at the output of main power amplifier 40 are minimized. The 5 KHz signal and error signal are then applied to the loop 2 control DSP 64' for generating the $V_{A2}$, $V_{\phi2}$ control signals. The $V_{A2}$, $V_{\phi2}$ control signals to the amplitude and phase adjustor 52 will adjust the error signal at the input of power amplifier 40 to drive the distortion signals at the output of power amplifier 40 to a minimum value.

An RF power amplifier with signal predistortion in accordance with the invention provides improved linearity. Closed loop control is provided to offset changes in signal level, temperature variation, frequency, and circuit component aging.

As described, the linear RF power amplifier in accordance with the invention eliminates or minimizes distortion in the power amplifier by predistorting the input signal. A pilot signal is not required as in prior art feedforward corrected power amplifiers. By reducing the frequencies of the signals applied to the loop control elements, digital signal processors can be readily employed for generating the amplitude and phase adjustor control signals. While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

What is claimed is:

1. A linear RF power amplifier comprising
   an input terminal for receiving RF carrier signals for amplification,
   a power amplifier having an input coupled to said input terminal and an output for amplified RF carrier signals, said power amplifier introducing intermodulation distortion into the amplified RF signals,
   a predistortion amplifier connected between said input terminal and said input of said power amplifier and having signal distortion characteristics of said power amplifier,
   a first control loop including a subtractor for receiving RF carrier signals from said input terminal and signals from said predistortion amplifier and producing a distortion signal with suppressed carrier signals for injection into said power amplifier, an amplitude and phase adjustor serially connected between said input terminal and said predistortion amplifier, a control unit for receiving RF signals from said input terminal and said distortion signal and controlling the phase and amplitude of at least one signal applied to said subtractor for minimizing RF carrier signals in said distortion signal, said control unit of said first control loop controlling said amplitude and phase adjustor, and
   a second control loop including an amplitude and phase adjustor for coupling said distortion signal to the power amplifier input, and a control unit coupled to the power amplifier output and the predistortion amplifier and controlling the amplitude and phase adjustor whereby the distortion signal offsets intermodulation distortion of the power amplifier.

2. The linear RF power amplifier as defined by claim 1 wherein each of said first loop control unit and said second loop control unit includes a digital signal processor.

3. The linear RF power amplifier as defined by claim 2 wherein each of said first control loop and said second control loop includes frequency reduction means for reducing the frequencies of signals applied to said digital signal processor.

4. The linear RF power amplifier as defined by claim 3 wherein said frequency reduction means in said first control loop includes first mixer means for mixing a first oscillator signal with said RF carrier signals and second mixer means for mixing a second oscillator signal having a delta (Δ) frequency offset from said first oscillator signal with said distortion signal, and first multiplier means for multiplying frequency difference components of said first mixer means and said second mixer means to obtain an error signal at a frequency of Δ, said digital signal processor of said first control loop receiving said error signal at frequency Δ and a reference signal at frequency Δ and generating said control signals for said first amplitude and phase adjustor.

5. The linear RF power amplifier as defined by claim 4 wherein said frequency reduction means in said second control loop includes third mixer means for mixing said RF carrier signals with each of said signals from said output of said power amplifier and said signals from said predistortion amplifier to eliminate RF carrier signals therefrom, fourth mixer means for mixing distortion signals from said output of said power amplifier provided by said third mixer means with a first oscillator signal, fifth mixer means for mixing distortion signals from said predistortion amplifier provided by said third mixer means with a second oscillator signal having a frequency offset from a frequency of said first oscillator, and second multiplier means for multiplying signals from said second fourth means and from said fifth mixer means and providing a control signal at said frequency offset to said digital signal processor in said second loop control unit.

6. A linear RF power amplifier, comprising
   an input terminal for receiving RF carrier signals for amplification,
   a power amplifier having an input and an output, means coupling said input terminal to said input of said power amplifier including a first amplitude and phase adjustor serially connected with a predistortion amplifier having signal distortion characteristics of said power amplifier,
   a first control loop including a subtractor for receiving RF carrier signals from said input terminal and signals from said predistortion amplifier and producing a distortion signal for injection into said power amplifier, and a first loop control unit for receiving RF carrier signals from said input terminal and said distortion signal and producing control signals for said first amplitude and phase adjustor for minimizing RF carrier signals in said distortion signal, and
   a second control loop including a path for connecting said distortion signal to said input of said power amplifier including a second amplitude and phase adjustor and an error amplifier, a second loop control unit for receiving signals from said output of said power amplifier and signals from said predistortion amplifier and generating control signals for said second amplitude and phase adjustor to minimize distortion in signals at said output of said power amplifier,
   wherein each of said first loop control unit and said second loop control unit includes a digital signal processor, and each of said first control loop and said second control loop including frequency reduction means for reducing the frequencies of signals applied to said digital signal processor.

7. The linear RF power amplifier as defined by claim 6 wherein said frequency reduction means in said first control loop includes first mixer means for mixing a first oscillator signal with said RF carrier signals and second mixer means for mixing a second oscillator signal having a delta (Δ) frequency offset from said first oscillator signal with said distortion signal, and first multiplier means for multiplying frequency difference components of said first mixer means and said second mixer means to obtain an error signal at a frequency of Δ, said digital signal processor of said first control loop receiving said error signal at frequency Δ and a reference signal at frequency Δ and generating said control signals for said first amplitude and phase adjustor.

8. The linear RF power amplifier as defined by claim 7 wherein said frequency reduction means in said second control loop includes third mixer means for mixing said RF carrier signals with each of said signals from said output of said power amplifier and said signals from said predistortion amplifier to eliminate RF carrier signals therefrom, fourth mixer means for mixing distortion signals from said output of said power amplifier provided by said third mixer means with a first oscillator signal, fifth mixer means for mixing distortion signals from said predistortion amplifier provided by said third mixer means with a second oscillator signal having a frequency offset from a frequency of said first oscillator, and second multiplier means for multiplying signals from said second fourth means and from said fifth mixer means and providing a control signal at said frequency offset to said digital signal processor in said second loop control unit.

9. The linear RF power amplifier as defined by claim 6 wherein said frequency reduction means in said second control loop includes first mixer means for mixing said RF carrier signals with each of said signals from said output of said power amplifier and said signals from said predistortion amplifier to eliminate RF carrier signals therefrom, second mixer means for mixing distortion signals from said output of said power amplifier provided by said first mixer means with a first oscillator signal, third mixer means for mixing distortion signals from said predistortion amplifier provided by said first mixer means with a second oscillator signal having a frequency offset from a frequency of said first oscillator, and first multiplier means for multiplying signals from said second mixer means and from said third mixer means and providing a control signal at said frequency offset to said digital signal processor in said second loop control unit.

10. An RF power amplifier having improved linearity comprising
    a power amplifier having an input and an output,
    an input terminal for receiving RF carrier signals for amplification,
    a first amplitude and phase adjustor and a predistortion amplifier serially connected between said input terminal and said input to said power amplifier,
    a first control loop including a subtractor responsive to signals at said input terminal and signals from said predistortion amplifier and producing a predistortion signal including intermodulation distortion components, and a control unit responsive to signals at said input terminal and said predistortion signal and producing control signals for said first amplitude and phase adjustor to minimize carrier signals in said predistortion signal and
    a second control loop including means including a second amplitude and phase adjustor for applying said predistortion signal to said input to said power amplifier, said second control loop being responsive to signals from said output of said power amplifier and signals from said predistortion amplifier and producing control signals for controlling said second amplitude and phase adjustor to reduce intermodulation distortion components at said output of said power amplifier, said second control loop including mixer means for receiving signals from said output of said power amplifier, signals from said predistortion amplifier, and carrier signals from said input terminal and producing a reference predistortion signal and a power amplifier output distortion signal in which carrier signals are eliminated, a first upconversion mixer for upconverting said reference predistortion signal to a first upconversion frequency, a second upconversion mixer for upconverting said power amplifier output distortion signal to a second upconversion frequency which differs from said first upconversion frequency by a frequency difference, $\Delta$, a multiplier for multiplying the upconverted power amplifier output distortion signal and the upconverted reference predistortion signal and producing an error signal at said frequency difference, $\Delta$, and a control unit responsive to said error signal to a reference signal at said frequency difference, $\Delta$, and producing control signals for said second amplitude and phase adjustor to reduce intermodulation components at said output of said power amplifier.

* * * * *